United States Patent [19]

Higashi et al.

[11] Patent Number: 5,220,189
[45] Date of Patent: Jun. 15, 1993

[54] MICROMECHANICAL THERMOELECTRIC SENSOR ELEMENT

[75] Inventors: Robert E. Higashi, Minneapolis; Robert G. Johnson, Minnetonka, both of Minn.

[73] Assignee: Honeywell Inc., Minneapolis, Minn.

[21] Appl. No.: 511,370

[22] Filed: Jul. 6, 1983

[51] Int. Cl.[5] ..................... H01L 23/56; H01L 27/14; H01L 29/06
[52] U.S. Cl. .................................. 257/467; 338/15; 338/18; 156/647
[58] Field of Search ....................... 357/29, 25, 26, 28, 357/55; 29/573; 338/15, 18, 22, 50; 156/647

[56] References Cited

U.S. PATENT DOCUMENTS 4,317,126  2/1982  Gragg ..................................... 357/55
4,472,239  9/1984  Johnson et al. ...................... 156/648

OTHER PUBLICATIONS

Ernest Bassous, "Fabrication of Novel Three-Dimensional Microstructures by the Anisotropic Etching of (100) and (110) Silicon," *IEEE Transactions on Electronics Devices*, vol. Ed-25, No. 10, pp. 1178-1185 (Oct. 1978).

Kurt E. Petersen, "Dynamic Micromechanics on Silicon: Techniques and Devices," *IEEE Transactions on Electronics Devices*, vol. Ed-25, No. 10, pp. 1241-1249 (Oct. 1978).

James B. Angell, Stephen C. Terry, Phillip W. Barth, "Silicon Micromechanical Devices," *Scientific American*, pp. 44-55 (Apr. 1983).

*Primary Examiner*—Andrew J. James
*Assistant Examiner*—Mark Prenty
*Attorney, Agent, or Firm*—Alfred N. Feldman; Michael B. Atlass

[57] ABSTRACT

A thermoelectric sensor element that is adapted to respond to thermal radiation is capable of manufacture into a sensor array on a single crystal semiconductor means, such as silicon. An anisotropically etched pit is provided under the sensing surface, and the pit generally corresponds to the geometry of the sensor element. The geometry is selected to be rectangular and falls along a selected orientation of the particular crystalline structure used for manufacture of the device to thereby allow for a high density of the sensor elements. The sensor elements are manufactured of two dissimilar metals in a sinuous pattern to provide the thermoelectric effect.

8 Claims, 2 Drawing Sheets

MICROMECHANICAL THERMOELECTRIC SENSOR ELEMENT

CROSS-REFERENCE TO RELATED APPLICATIONS

The present application is related to the subject matter of an application entitled "Integrated Micromechanical Sensor Element" filed on Jul. 6, 1983, as Ser. No. 511,369, in the names of R. E. Higashi and R. G. Johnson and which is assigned to the assignee of the present application.

The present application is also related to the subject matter of an application entitled "Semiconductor Device" filed on Oct. 9, 1981, (Ser. No. 310,345, now abandoned) in the names of R. G. Johnson and R. E. Higashi and which is also assigned to the assignee of the present invention.

BACKGROUND OF THE INVENTION

The production of exceedingly small sensing and control devices has been developed to a high state of perfection over the last 30 years. In the last 30 years, the manufacture of mass-produced microelectronic circuits on silicon wafers has become the forerunner of the production of various other devices by similar manufacturing techniques. The fabrication of novel three-dimensional microelectronic devices in a semiconductor crystal, typically silicon, has been accomplished by fabricating the device through many techniques including isotropic and anisotropic etching. These techniques utilize the crystalline structure of a single crystal semiconductor. The techniques have evolved to the point where devices that are only a few thousandths of an inch in dimension are manufactured in quantity.

The state of the art generally can be found in considering the cross-referenced pending patent applications, and in a number of published articles. The citation of this type of article in the present text is provided merely as background, and the articles are not deemed as prior art to the specific invention claimed in this application. Articles of particular interest are found in *IEEE Transactions on Electronics Devices,* Volume Ed-25, No. 10, October 1978, at pages 1178 and 1241. The article appearing at page 1178 is entitled "Fabrication of Novel Three-dimensional Microstructures by the Anisotropic Etching of (100) and (110) Silicon" by E. Bassous. The article appearing at page 1241 is entitled "Dynamic Micromechanics on Silicon: Techniques and Devices" by K. E. Petersen. Also of interest as general background is an article entitled "Silicon Micromechanical Devices" which was published on pages 44-55 of the April 1983 issue of *Scientific American.*

The articles and pending application referenced above show clearly that it is old, and the technique well-known, to manufacture micromechanical devices by etching into a single crystal silicon. The etching techniques generally rely on obtaining the maximum speed of etching, and as such, the planes within the crystal typically dictate the orientation of the device on the surface of the structure The dictation of the orientation of the manufactured device on the surface of a single crystal silicon provides a utilitarian way of producing certain individual devices Typically, the silicon structure is separated after manufacture so that the individual devices can be utilized separately and the orientation of the device with respect to the crystalline structure usually leaves unused surfaces of the silicon crystal. Sometimes these unused surfaces are adapted for use as an area upon which integrated circuitry is placed to function with the device manufactured by the etching technique. In other cases, the area is merely wasted area.

DESCRIPTION OF THE INVENTION

The present invention is directed to the design and manufacture of a thermoelectric sensor element that can be used in an array of sensor elements to respond to thermal radiation. Where a group of sensor elements are to be placed in an array, the waste of space in the manufacture of the elements is very undesirable. The wasted space tends to make an array of elements inefficient and severely reduces the number of sensor elements that can be manufactured in a size and configuration that is practical for sensing of radiation. The present invention is directed to the concept of orienting a thermoelectric type of sensing element in the most efficient and concentrated configuration. This arrangement is not necessarily the most efficient or practical configuration for the use of an etchant to manufacture the overall device. As such, a practical way must be found to etch a pit under the sensor element which isolates the sensor element thermally from the balance of the silicon semiconductor crystal. By properly arranging at least two separate surface areas which semi-enclose the sensing element in a sinuous path, an etching arrangement can be provided which is sufficiently rapid to manufacture the device without degrading the quality of the device, while limiting the etched pit beneath the sensing element to an area that generally corresponds to the sensing element.

By providing a configuration of areas which contains a large number of convex corners, the etching process can proceed rapidly despite the compromise in the position of the thermoelectric sensing element with respect to the crystalline structure of the semiconductor crystal. By providing a sinuous path, not only can a large number of convex corners be provided, but a sufficient length of a path can be created so that a first or "hot" thermoelectric junction can be provided which is adequately isolated in a thermal sense from a second or "cold" junction.

More specifically, the present invention is directed to laying out a sinuous path on a semiconductor surface by interlocking two surface areas that are used for etching a pit beneath the sensing element by means of an anisotropic etch. The sinuous path that is created in the thermoelectric sensing element can be oriented in a manner that does not take into consideration the most rapid etching of a pit, but one which is dictated by maintaining a pit of the same shape and size as the sensing element directly beneath it. By arranging the two separate areas properly, a sufficiently fast etch can be obtained to etch out a pit beneath the sensing area and where the pit generally has a perimeter defined by planes corresponding to the areas used for etching. The relatively rapid etch does not allow for the degradation of the device, but does allow for a sufficiently rapid etch of the pit. By orienting the surface areas to lie along and perpendicular to a selected orientation of the specific crystalline structure within the semiconductor crystal, the etched pit generally corresponds in size and shape to the sensor element, and this allows the placement of the sensor element in a close side-by-side relationship, thereby providing an efficient use of the surface of the semiconductor crystal to build a concentrated array of sensor elements. In accordance with the present invention, there is provided a micromechanical thermoelectric sensor element for use in an array of sensor elements which are adapted to respond to thermal radiation, including: single crystal semiconductor means containing a plurality of planes defined by the specific crystalline structure within said semiconductor means; said semiconductor means having a generally flat surface including thermal radiation sensing means having two leadout means; two separate surface areas forming a sinuous path which semi-encloses said sensing means with said two surface areas forming at least six convex corners; said two surface areas further defining two leadout areas with each of said leadout areas providing a support upon which one of said sensor leadout means is located; said sensing means including two separate dissimilar conductive materials that are joined within said sinuous path to form a first thermoelectric junction for said thermal radiation sensing means; said leadout areas providing a second thermoelectric junction for said thermal radiation sensing means; a pit below said surface to substantially thermally isolate said sensing means from the balance of said semiconductor means with said pit anisotropically etched through said two surface areas and limited in size by said planes within said single crystal semiconductor means; said planes intersecting said two surface areas which semi-enclose said sensing means to define a perimeter of said pit to generally correspond with said two surface areas; and said two surface areas having sides that lie along and perpendicular to a selected orientation of said specific crystalline structure

DESCRIPTION OF THE PREFERRED EMBODIMENT

Figure 1:
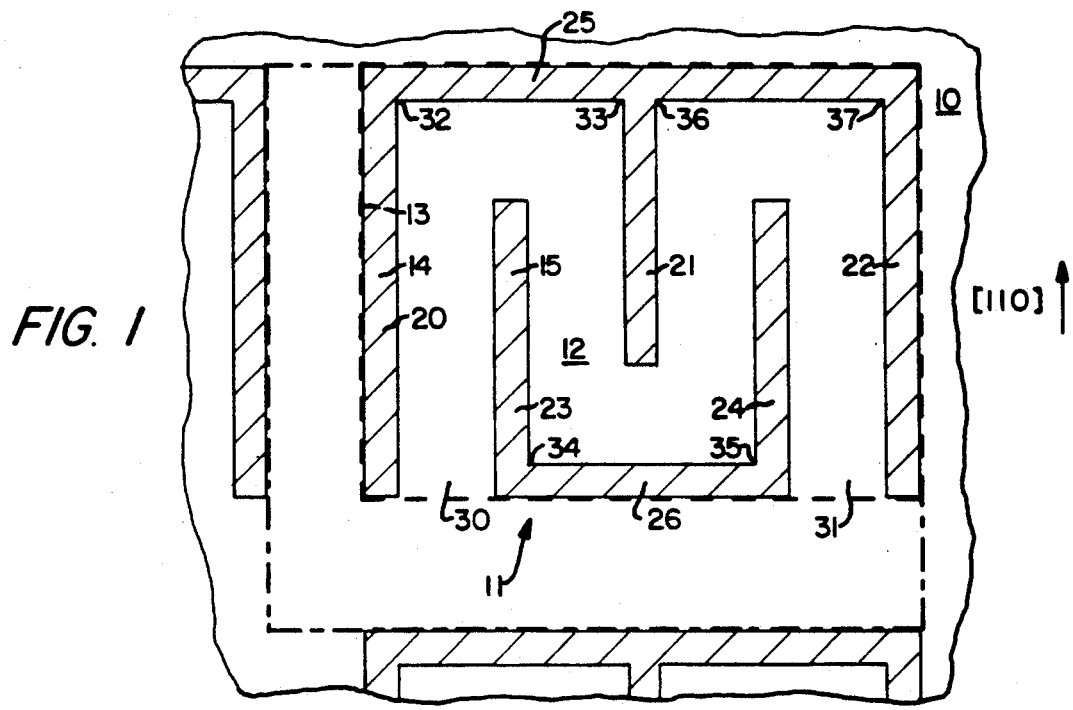
FIG. 1 is a plane view of a single thermoelectric sensor configuration disclosed as part of an array.

In FIG. 1, a view of the masking for the fabrication of a micromechanical element is provided. The micromechanical element is to be provided on the surface of a single crystal semiconductor means disclosed at 10. The single crystal semiconductor means 10 typically would be silicon, and the surface would be prepared as comparable to the preparation in the art relating to high quality, high density integrated circuits. The orientation of the placement of the sensor structure is generally disclosed at 11. The placement of the structure 11 is important to the present invention, and as such, the structure 11 is placed on a (100) surface of the silicon 10 so that its axes are oriented parallel to and perpendicular to the [110] or equivalent direction of the crystalline structure of the semiconductor means. This point will be explained in more detail after a description of the structure has been presented. The structure 11 is prepared by providing a sensing area identified at 12. The perimeter of the sensing area is identified by dashed lines 13 which encompasses the area 12 including a pair of areas 14 and 15. The two areas 14 and 15 have been shaded to clearly identify the two surface areas. The areas 14 and 15 are provided on the surface of the silicon semiconductor crystal 10 by any convenient process as was described in the Background of the Invention. All of the surface of the semiconductor 10 is protected from an etchant except the two areas 14 and 15, and the etching of a pit by an anisotropically etchant through the two surface areas 14 and 15 provides a pit 16 (FIG. 2) as indicated with the perimeter 13.

Again referring to FIG. 1, the areas 14 and 15 have a number of parallel legs 20, 21, 22, 23, and 24. The parallel legs 20, 21, and 22 are connected by a perpendicular bight 25, while the two legs 23 and 24 are connected by a bight 26 which is parallel to the bight 25. The two interlocked areas 14 and 15 provide a long sinuous surface starting at 30 and progressing to the other end or surface 31. The two surfaces 30 and 31 provide two leadout areas upon which the thermoelectric sensor element is to be placed, as will become apparent in connection with FIG. 3. It will be further noted that the areas 14 and 15 define six convex corners 32, 33, 34, 35, 36, and 37. The six convex corners are very important to the rapid and proper etching of the pit 16 as will be explained.

Figure 2:
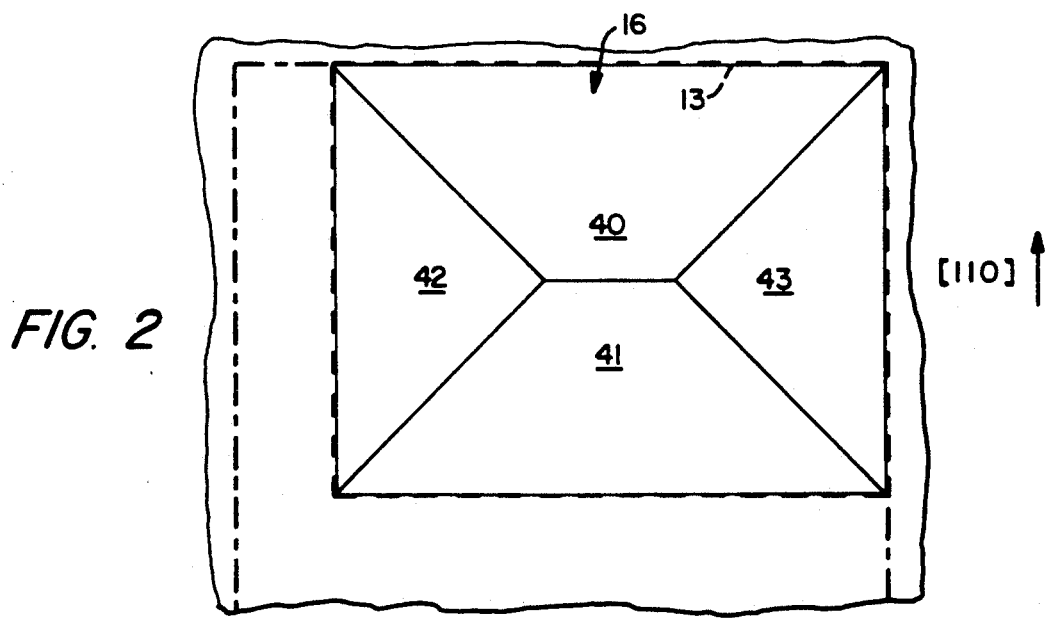
FIG. 2 is a plane view showing the etched pit beneath the sensor element.

The surface preparation disclosed in FIG. 1 provides for the surface areas 14 and 15 on the surface of a semiconductor 10 and oriented so that the legs 20, 21, 22, 23, and 24, along with the bights 25 and 26, define a sinuous path which semi-encloses the surface area 12 upon which the sensing element is to be fabricated. The sensing element is rather long and is connected at two leadout areas 30 and 31 to the balance of the surface of the semiconductor 10. With the pattern disclosed in FIG. 1, an anisotropically etched pit of FIG. 2 can be provided with a rectangular outline 13 that has sides that lie along and perpendicular to a selected orientation of the specific crystalline structure of the semiconductor or silicon crystal 10. The orientation disclosed which is parallel to and perpendicular to the legs of the two areas 14 and 15 provide for the etching of a rectangular pit 16 defined by the perimeter 13. The pit is etched by known techniques, and the fact that six convex corners are present allow for a very rapid etching of the pit with the etching beginning in the convex corners and spreading in a pattern that is disclosed in FIG. 2. In FIG. 2, the pattern of the pit 16 is disclosed wherein the pit is rectangular in area and lies immediately beneath the surface 12 upon which the sensor is to be provided. Due to the structure of the crystal within the silicon 10, the pit etches out from the six convex corners quite rapidly and is limited in its etched configuration to a pit having four sloping (111) sides 40, 41, 42, and 43. The nature of the areas 14 and 15, along with their corners, provides a reasonably rapid etching rate. Therefore, it is unnecessary to choose the optimum orientation of the structure for etching. The selection of the orientation of the areas 14 and 15 is for the maximum concentration of elements on a surface and can be accomplished without undue length in etching time for the pit 16.

Figure 3:
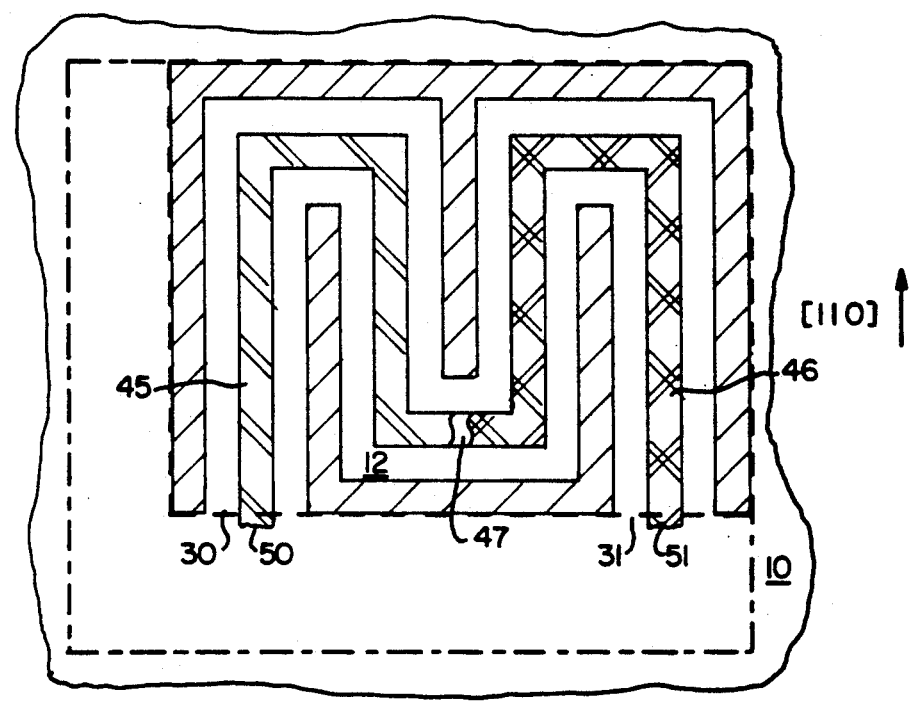
FIG. 3 is a plane view of a completed thermoelectric sensor element.

In FIG. 3, a substantially complete thermoelectric sensing element is disclosed utilizing the configuration of FIG. 1. To complete the thermoelectric sensor element, two dissimilar conductive materials 45 and 46 are deposited on the surface 12 in a sinuous fashion with a junction at 47. The junction of the two dissimilar materials forms a junction for a thermoelectric element, and this junction typically would be referred to as the "hot" junction. The "cold" junction would be at the locations 50 and 51 where the metals 45 and 46 exit the leadout areas 30 and 31. The leadout areas 30 and 31 support the surface 12 with the two dissimilar metals 45 and 46 and the hot junction 47 over the pit 16. As such, the sinuous thermoelectric sensor element is basically isolated thermally from the silicon crystal 10. The portions 50 and 51 of the sensor element, and their electrical connections shown schematically in FIG. 4, are in direct contact with the silicon crystal 10 and therefore form a "cold" junction as the silicon crystal forms a large heat sink or cold surface to provide the necessary components for a highly efficient thermoelectric sensing element.

The preferred metals for the two metals 45 and 46 would be pure iron and molybdemum, although other combinations of metals, and even semiconductors such as silicon and/or germanium could be used. The use of sputter deposition of metal lines is applicable to a wide variety of materials, and would be the preferred method of disposition of the conductors 45 and 46 in sensor 12. Any technique for laying out the pattern of the two dissimilar conductive materials can be used, and the use of sputter deposition is merely an example of one preferred method. Also, to effectively absorb infrared radiation on the surface, a thin film of resistive material could be deposited on top of the structure disclosed in FIG. 3 after its fabrication. This material has not been shown in the drawings and is not part of the claimed invention.

While the device disclosed in FIG. 3 utilizes a sinuous path having the specifically disclosed geometry, it is quite apparent that this geometry could be extended endlessly to provide as long a thermoelectric sensor element as is desired. In the device disclosed, the dimensions of the thermoelectric sensor element are approximately 51 microns by 60 microns. In this configuration, the two loops are practical, and a sensor element that can be placed compactly into an array is provided The array could be multiplexed, or the individual sensor elements could drive metal-oxide semiconductor field-effect transistors mounted on the silicon surface 10. This is disclosed schematically in FIG. 4.

Figure 4:
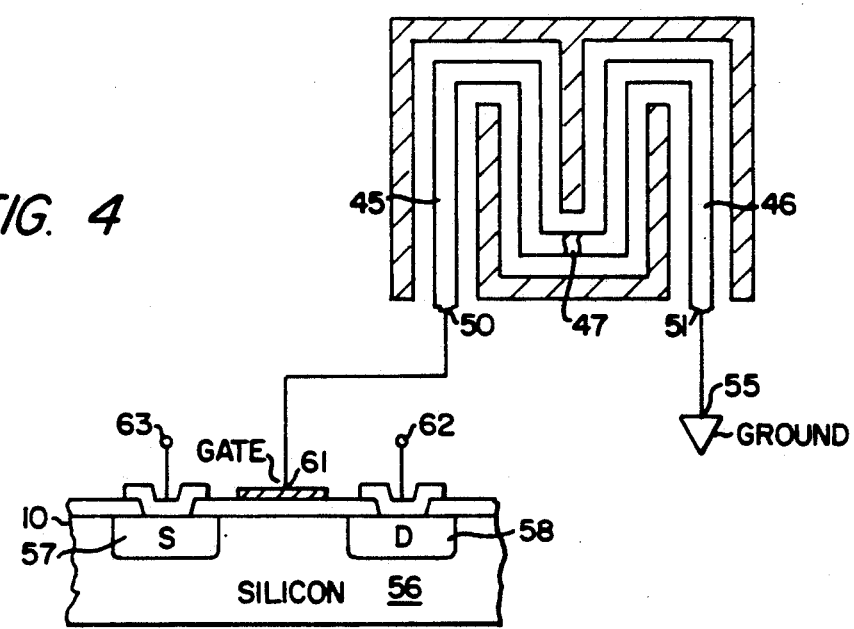
FIG. 4 is a schematic of a thermoelectric sensor element connected to a metal-oxide semiconductor field-effect transistor.

In FIG. 4, a sensor is disclosed with the metal 46 terminated in a ground connection 55, and where the metal 45 is connected at 50 to a conductor that is integrated directly on the surface 10 of the silicon semiconductor means. A cross section of a typical metal-oxide semiconductor field-effect transistor is disclosed at 56 in which a source 57 and a drain 58 are integrated into the silicon surface 10, and a gate 61 is provided between the terminals 62 and 63. With this structure, the metal 45 is connected to the floating gate 61 of the metal-oxide semiconductor field-effect transistor 56, and the other metal 46 is grounded. The junction 47 is located symmetrically at a maximum distance from the points of attachment of the sinuous structure to the silicon substrate and consequently at the point of maximum thermal isolation. The junction 47, therefore, is located at the point of greatest differential temperature rise on the sinuous structure when subjected to the absorption of locally uniform radiation falling on the sensor element 12. This maximizes the voltage output of the thermocouple or thermoelectric sensor element which is then measured in terms of an altered metal-oxide semiconductor field-effect transistor drain current. As was indicated, a single element could be used, or they could be manufactured into an array and multiplexed for sensing, display, or any other convenient purpose.

A number of variations of materials and geography for the placement of the sensor element on the crystalline structure has been disclosed. In all the cases disclosed, the anisotropic etch maintains a pit area that is rectangular and tightly configured to the sensing area. As such, the number of sensing areas can be economically and compactly manufactured into a single crystal semiconductor means or silicon wafer, thereby providing an economical and effective array of radiation sensors. Since a number of configurations and techniques have been disclosed, the applicants wish to be limited in the scope of their invention solely by the scope of the appended claims.

The embodiments of the invention in which an exclusive property or right is claimed are defined as follows:

1. A micromechanical thermoelectric sensor element for use in an array of sensor elements which are adapted to respond to thermal radiation, including: single crystal semiconductor means containing a plurality of planes comprising a family of (111) planes defined by the specific crystalline structure within said semiconductor means; said semiconductor means having a generally flat surface supporting thermal radiation sensing means having two leadout means; two separate surface areas forming a sinuous path which semi-encloses said sensing means with said two surface areas forming at least six convex corners; said two surface areas further defining two leadout areas with each of said leadout areas providing a support upon which one of said sensor leadout means is located; said sensing means including two separate dissimilar electrically conductive materials that are joined within said sinuous path to form a first thermoelectric junction for said thermal radiation sensing means; said leadout areas providing a second thermoelectric junction for said thermal radiation sensing means; a pit below said surface to substantially thermally isolate said sensing means from the balance of said semiconductor means with said pit anisotropically etched through said two surface areas and limited in size by said planes within said single crystal semiconductor means; said planes intersecting said two surface areas which semi-enclose said sensing means to define a perimeter of said pit to generally correspond with said two surface areas; and said two surface areas having sides that lie along and perpendicular to a [110] direction of said specific crystalline structure.

2. A micromechanical thermoelectric sensor element as described in claim 1 wherein said separate surface areas are displaced from each other to provide said leadout areas; and said separate areas further effectively interlock in directions along and perpendicular to said [110] direction of said specific crystalline structure to form said sinuous path.

3. A micromechanical thermoelectric sensor element as described in claim 2 wherein said single crystal semiconductor means in silicon.

4. A micromechanical thermoelectric sensor element as described in claim 3 wherein said surface areas each include a plurality of legs and a connecting bight that is generally perpendicular to said legs.

5. A micromechanical thermoelectric sensor element as described in claim 4 wherein said legs of said surface areas define said two leadout areas; said two leadout areas being of minimum size to support said sensor means over said pit while providing support for said sensor leadout means as well as providing said second thermoelectric junction.

6. A micromechanical thermoelectric sensor element as described in claim 5 wherein said first thermoelectric junction is at a center of said sinuous path.

7. A micromechanical thermoelectric sensor element as described in claim 5 wherein said two separate dissimilar electrically conductive materials are dissimilar metals.

8. A micromechanical thermoelectric sensor element as described in claim 6 wherein said two separate dissimilar electrically conductive materials are dissimilar metals.

* * * * *